(12) United States Patent
Al-Hemyari et al.

(10) Patent No.: US 12,242,782 B2
(45) Date of Patent: Mar. 4, 2025

(54) DIGITALLY CONTROLLED GROUND INDUCTOR SIMULATION CIRCUITS

(71) Applicants: SAUDI ARABIAN OIL COMPANY, Dhahran (SA); KING FAHD UNIVERSITY OF PETROLEUM & MINERALS, Dhahran (SA)

(72) Inventors: Emad Abdo Mohammed Al-Hemyari, Dhahran (SA); Abdulrahman Alshuhail, Dhahran (SA); Hussain Alzaher, Dhahran (SA); Abdullatif Al-Shuhail, Dhahran (SA)

(73) Assignees: SAUDI ARABIAN OIL COMPANY, Dhahran (SA); KING FAHD UNIVERSITY OF PETROLEUM & MINERALS, Dhahran (SA)

(*) Notice: Subject to any disclaimer, the term of this patent is extended or adjusted under 35 U.S.C. 154(b) by 889 days.

(21) Appl. No.: 17/337,671

(22) Filed: Jun. 3, 2021

(65) Prior Publication Data
US 2022/0391570 A1 Dec. 8, 2022

(51) Int. Cl.
*G06F 30/3308* (2020.01)
*G01R 31/72* (2020.01)
(Continued)

(52) U.S. Cl.
CPC ......... *G06F 30/3308* (2020.01); *G01R 31/72* (2020.01); *G01V 1/003* (2013.01); *G01V 1/181* (2013.01)

(58) Field of Classification Search
CPC ........... H03F 3/45269; H03F 2200/129; H03F 2203/45528; G06F 30/3308; G01R 31/72; G01V 1/003; G01V 1/181
See application file for complete search history.

(56) References Cited

U.S. PATENT DOCUMENTS

| 3,573,647 A | 4/1971 | Antoniou |
|---|---|---|
| 3,835,399 A | 9/1974 | Holmes |

(Continued)

FOREIGN PATENT DOCUMENTS

WO 2018/050221 A1 3/2018

OTHER PUBLICATIONS

H. A. Alzaher, "A CMOS digitally programmable filter technique for VLSI application" pp. 178-187, 2008.*
(Continued)

*Primary Examiner* — Kibrom K Gebresilassie
(74) *Attorney, Agent, or Firm* — Osha Bergman Watanabe & Burton LLP

(57) ABSTRACT

A system for a first digitally controlled grounded inductor simulation circuit may include an OP-AMP, a digitally controlled current amplifier (DCCA), a voltage buffer, two resistors, and a capacitor. The first digitally controlled grounded inductor simulation circuit allows adjustment of an equivalent inductance value ($CR_1R_2/A$) through programming a digitally controlled current gain (A) of the DCCA. A system for a second digitally controlled grounded inductor simulation circuit includes an OP-AMP, a digitally controlled current amplifier (DCCA), a dual output current follower (CF), an active current division network (CDN), two resistors, and a capacitor. The second digitally controlled grounded inductor simulation circuit allows adjustment of an equivalent inductance value ($CR_1R_2/\alpha A$) via programming the active CDN and the DCCA.

20 Claims, 11 Drawing Sheets

(51) Int. Cl.
*G01V 1/00* (2006.01)
*G01V 1/18* (2006.01)

(56) References Cited

U.S. PATENT DOCUMENTS

| | | | |
|---|---|---|---|
| 4,383,230 | A | 5/1983 | Manzolini |
| 5,585,741 | A | 12/1996 | Jordan |
| 5,600,288 | A | 2/1997 | Liu |
| 6,809,616 | B2 | 10/2004 | Liu et al. |
| 7,042,317 | B2 | 5/2006 | Xiao et al. |
| 7,068,130 | B2 | 6/2006 | Redoute et al. |
| 8,253,504 | B2 | 8/2012 | Huang |
| 8,482,343 | B1 * | 7/2013 | Alzaher ............ H03H 11/1291 327/553 |
| 8,896,371 | B2 | 11/2014 | Alzaher |
| 9,548,721 | B1 | 1/2017 | Abuelma'atti et al. |
| 10,177,743 | B2 | 1/2019 | Britz |
| 2005/0083151 | A1 | 4/2005 | Xiao et al. |
| 2007/0179713 | A1 * | 8/2007 | Scott ...................... G01V 13/00 702/14 |
| 2010/0253441 | A1 | 10/2010 | Huang |
| 2013/0202066 | A1 | 8/2013 | Alzaher |

OTHER PUBLICATIONS

U. Kumar, S. K. Shukla, "Analytical Study of Inductor simulation circuits", pp. 211-227, 1989.*

Yuce, Erkan et al., "A Modified CFOA and Its Applications to Simulated Inductors, Capacitance Multipliers, and Analog Filters"; IEEE Transactions on Circuits and Systems I: Regular Papers; vol. 55, No. 1; pp. 266-275; Feb. 2008 (10 pages).

Al-Absi, Munir A., "Realization of a Large Values Floating and Tunable Active Inductor"; IEEE Access; vol. 7; pp. 42609-42613; Apr. 12, 2019 (5 pages).

López-Morillo, E. et al., "A Very Low-Power Class AB/AB Op-amp based Sigma-Delta Modulator for Biomedical Applications"; Proceedings of the 2006 49th IEEE International Midwest Symposium on Circuits and Systems (MWSCAS'06); vol. 2; pp. 458-462; Aug. 6-9, 2006 (5 pages).

Alzaher, Hussain A. et al., "A CMOS Highly Linear Channel-Select Filter for 3G Multistandard Integrated Wireless Receivers"; IEEE Journal of Solid-State Circuits; vol. 37, No. 1; pp. 27-37; Jan. 2002 (11 pages).

Durham, Anna M. et al., "High-Linearity Continuous-Time Filter in 5-V VLSI CMOS"; IEEE Journal of Solid-State Circuits; vol. 27, No. 9; pp. 1270-1276; Sep. 1992 (7 pages).

Alzaher, Hussain Abdullah, "A CMOS digitally programmable filter technique for VLSI applications"; Analog Integrated Circuits and Signal Processing; vol. 55, Issue 2; pp. 177-187; May 2008 (11 pages).

Ledvina, Jan et al., "A fully integrated digitally controllable grounded inductor simulator with a large inductance range for damping of ultrasonic transducers"; Analog Integrated Circuits and Signal Processing; Jan. 25, 2019 (6 pages).

Alzaher, Hussain et al., "A class of digitally programmable nth-order filters"; International Journal of Circuit Theory and Applications; Mar. 29, 2011 (14 pages).

Singh, Devesh et al., "CMOS Digitally Programmable Grounded Inductor"; Proceedings of the 2014 International Conference on Signal Processing and Integrated Networks (SPIN); pp. 492-496; Feb. 20-21, 2014 (5 pages).

Alzaher, Hussain A. et al., "Digitally programmable high-order current-mode universal filters"; Analog Integrated Circuits and Signal Processing; vol. 67, Issue 2; pp. 179-187; May 2011 (9 pages).

* cited by examiner

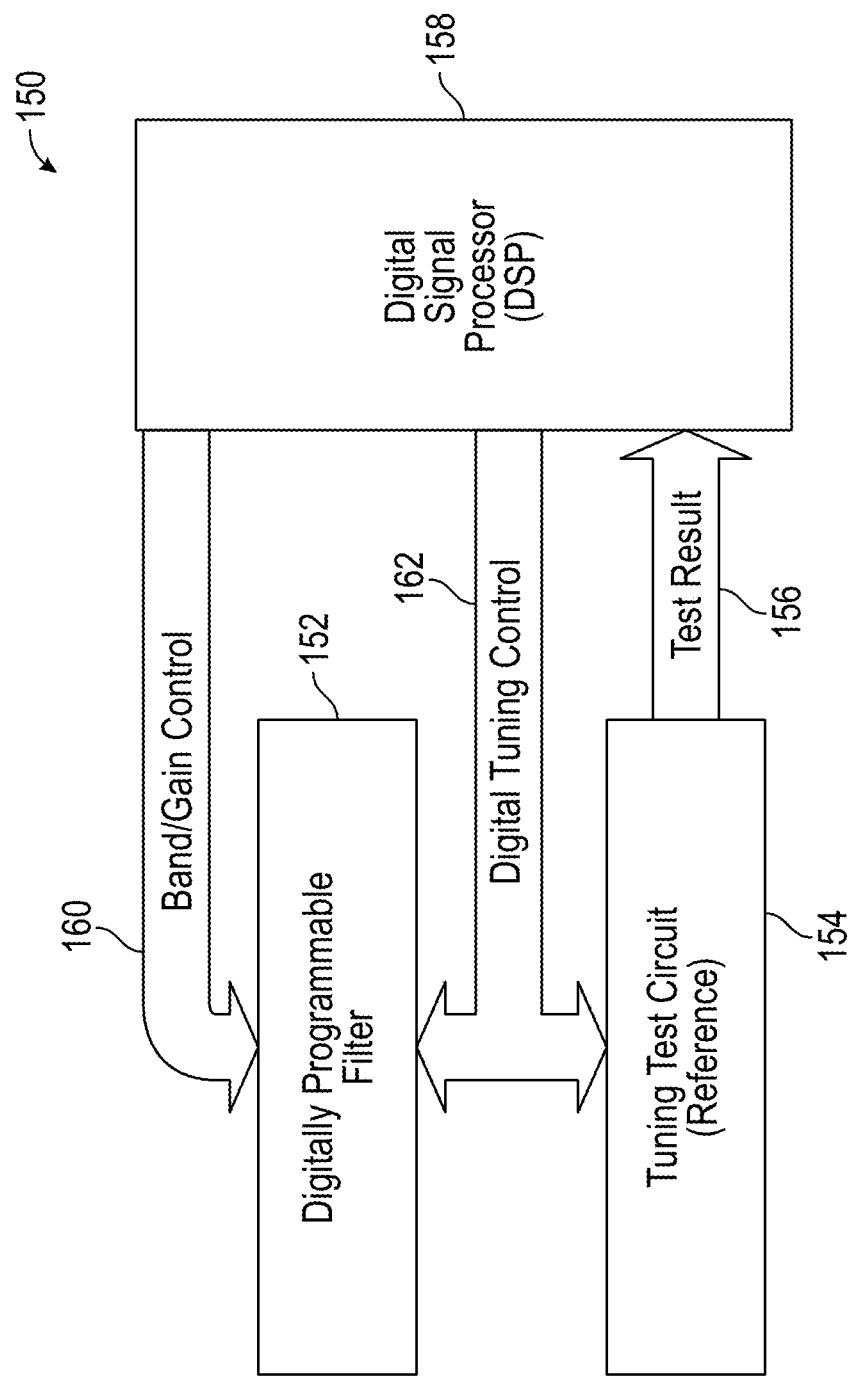
FIG. 1B: Prior Art

DIGITALLY CONTROLLED GROUND INDUCTOR SIMULATION CIRCUITS

FIELD OF THE INVENTION

The invention generally relates to the field of electronic circuits and, in particular, to integrated circuit (IC) methods and circuits for implementing complementary metal-oxide-semiconductor (CMOS) mixed analog/digital systems.

BACKGROUND

It is still a problem to implement inductors into fully integrated circuit (IC) technology. One of the widely used on-chip inductors is the planar spiral. However, aside from the large areas that are potentially consumed, another serious problem with spiral inductors is their relatively large loss. Fortunately, active circuits can sometimes synthesize the equivalent of an inductor with high-quality factor (Q). Also, it is well known that, in IC processes, the realization of grounded passive components, especially grounded capacitors, are more convenient than floating ones. Hence, the circuit designer should avoid using floating passive components and passive component-matching constraints as much as possible. For this purpose, there exists a need for active circuits for realizing grounded inductors.

An inductor simulator is a circuit that transforms a load capacitance into an inductance. They are widely used in low-frequency filter designs. They are used to mimic ideal coil based passive inductors. They are attractive for ICs as passive inductor are not standard elements. To be used in integrated filter design in particular, the inductor circuit should have programmability feature to tune the filter parameters. This allows utilization of the advanced digital signal processing (DSP) part for controlling the operation of frequency characteristics of the analog circuits, which eliminates the need for auxiliary digital to analog converters from the DSP to control the analog part. However, this is often challenging as discrete components of the Analog Digitizer Units (ADUs) used in geophone systems are assembled in printed circuit board and, hence, they occupy large area and are cost inefficient. For reducing the size and improving the performance, a fully integrated ADU in a single IC may need to be implemented.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments disclosed herein relate to a system for a digitally controlled grounded inductor simulation circuit may include an OP-AMP, a digitally controlled current amplifier (DCCA), a voltage buffer, two resistors, and a capacitor. The digitally controlled grounded inductor simulation circuit allows adjustment of an equivalent inductance value ($CR_1R_2/A$) through programming a digitally controlled current gain (A) of the DCCA.

In another aspect, embodiments disclosed herein generally relate to system for a digitally controlled grounded inductor simulation circuit includes an OP-AMP, a digitally controlled current amplifier (DCCA), a dual output current follower (CF), an active current division network (CDN), two resistors, and a capacitor. The digitally controlled grounded inductor simulation circuit allows adjustment of an equivalent inductance value ($CR_1R_2/\alpha A$) via programming the active CDN and the DCCA.

In another aspect, embodiments disclosed herein generally relate to a method for a digitally controlled grounded inductor simulation circuit. The method includes forming a first digitally controlled grounded inductor simulation circuit. The method further includes forming a second digitally controlled grounded inductor simulation circuit. The method further includes determining a first equivalent inductance value ($CR_1R_2/A$) of the first digitally controlled grounded inductor simulation circuit. The method further includes determining a second equivalent inductance value ($CR_1R_2/\alpha A$) of the second digitally controlled grounded inductor simulation circuit. The method further includes adjusting the first equivalent inductance value through programming a first DCCA of the first digitally controlled grounded inductor simulation circuit. The method further includes adjusting the second equivalent inductance value through programming a second DCCA and an active CDN of the second digitally controlled grounded inductor simulation circuit.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIGS. 1A and 1B show systems in accordance with one or more embodiments.

Like elements in the various figures are denoted by like reference numerals for consistency.

DETAILED DESCRIPTION

Figure 1A:
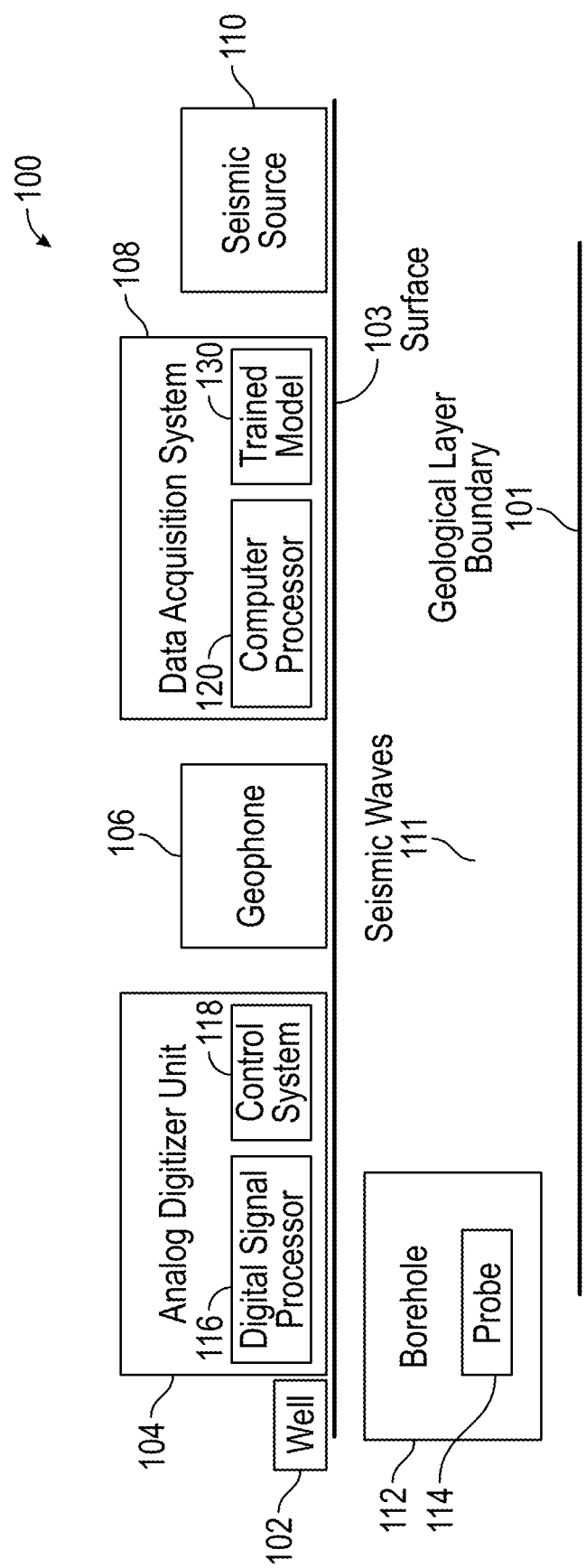

Specific embodiments of the disclosure will now be described in detail with reference to the accompanying figures.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (for example, first, second, third) may be used as an adjective for an element (that is, any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-10, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope of the invention should not be considered limited to the specific arrangement of steps shown in the flowcharts.

Although multiply dependent claims are not introduced, it would be apparent to one of ordinary skill that the subject matter of the dependent claims of one or more embodiments may be combined with other dependent claims.

In general, one or more embodiments are directed to a system and method for implementing digitally controlled ground inductor simulation circuits. More specifically, the invention includes the two digitally controlled grounded inductor circuits. The first circuit adopts an OP-AMP, a digitally controlled current amplifier, a voltage buffer, two resistors, and a capacitor. The second circuit uses an OP-AMP, a digitally controlled current amplifier, a dual output current follower, an active current division network, two resistors, and a capacitor. The circuits are designed using a standard CMOS technology. The value of an equivalent inductance of the first circuit can be adjusted through programming a gain of the current amplifier. An equivalent inductance of the second circuit can be further programmed via the active current division network. Therefore, embodiments disclosed herein may implement the digitally controlled ground inductor simulation circuits to be used in high-performance analog and mixed signal ICs. Other embodiments may implement a fully integrated Analog Digitizer Unit (ADU) in a single analog and mixed signal IC to reduce the size and improve the performance.

Embodiments of the invention may be used to implement fully integrated ADU used in geophone system to assist in seismic data acquisition, VLSI applications, and in mixed analog/digital systems for digital tuning to allow direct interfacing with the DSP part. Inductor simulation circuits are of particular importance in many applications such as low-frequency active filters, Wilkinson power drives, phase shifters, oscillators, low noise amplifiers and matching networks. They are attractive for ICs as passive inductor are not standard elements. To be used in integrated filter design in particular, the inductor circuit should have programmability feature to tune the filter parameters. Low frequency applications include biomedical and environmental monitoring systems.

FIG. 1A shows a schematic diagram in accordance with one or more embodiments. FIG. 1A illustrates a system for a geophone system to assist in a seismic data acquisition environment (100) that may include a well (102), an analog digitizer unit (ADU) (104), a geophone (106), a data acquisition system (108), and a seismic source (110) generating seismic waves (111). The well (102) may include a borehole (112) with a probe (114) that extends from a surface (103) into an underground limited by a geological layer boundary (101).

The geophone (106) converts ground movement (velocity) into voltage, which may be recorded at the data acquisition system (108). The deviation of this measured voltage from the base line is called the seismic response and is analyzed for structure of the earth. In general, 1~3 Hz geophones are applied for deep seismic prospecting, natural earthquake surveillance and prediction, pulse and micro seismic measurement for bridge and highways, etc. In some embodiments, 4~400 Hz geophones are widely used to seismic prospecting of petroleum, coal, metallurgy, defense engineering and the like. A trigger event synchronizes data acquisition in the probe (114). The geophone (106) at the surface (103) allows precise timing analyses. The surface equipment is usually a winch with logging cable and the seismic source (110) (for example, drop-weight or vibrator). The seismic source (110) produces the seismic waves (111) in underground and emits a trigger signal, for example, from a piezo or a hammer switch.

Keeping with FIG. 1A, the ADU (104) may include a digital signal processor (DSP) (116) and a control system (118). In the ADU (104), analog and digital parts are incorporated. Therefore, digital tuning of analog part is preferred at it allows utilization of the DSP (116) for controlling the frequency characteristics operation of the analog circuits in the ADU (104). This eliminates the need for auxiliary digital to analog converters from the DSP (116) to control the analog part. Fully differential architectures are essential to enhance the performance of mixed analog/digital systems in terms of supply noise rejection, dynamic range, and harmonic distortion and to reduce the effect of coupling between various blocks.

In some embodiments, the control system (118) may couple to logging and drilling system of the well (102). The control system (118) may further include a plurality of sensors, for example, geophones, hydrophone, compass, connected to powerful electronic boards including and analog-to-digital converter and the DSP (116) and hardware or software for managing drilling operations or maintenance operations. For example, the control system (118) may include one or more programmable logic controllers (PLCs) that include hardware or software with functionality to control one or more processes performed by the drilling system of the well (102). Specifically, a programmable logic controller may control valve states, fluid levels, pipe pressures, warning alarms, or pressure releases throughout a drilling rig. In particular, a programmable logic controller may be a ruggedized computer system with functionality to withstand vibrations, extreme temperatures (for example, ~575° C.), wet conditions, or dusty conditions, for example, around a drilling rig.

In one or more embodiments, the initial recognition makes it possible to verify the favorable geometric and hydrogeological conditions and the progressive digging of the wells makes it possible to confirm them, by sampling samples and logistic measurements (one goes down into a well, at the end of a cable, a sensor which measures the gas and water content, water pressure, porosity, temperature etc.) using the programmable logic controller. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress.

Turning to the data acquisition system (108), the data acquisition system (108) may include hardware or software with functionality for generating one or more trained models (130) regarding the seismic data acquisition system environment (100). For example, the data acquisition system (108) may obtain data from the well (102) and store well logs and data regarding core samples, and further analyze the well log data, the core sample data, or other types of data to generate or update the one or more trained models (130) having a complex geological environment. For example, different types of models may be trained, such as artificial intelligence, convolutional neural networks, deep neural networks, support vector machines, decision trees, inductive learning models, deductive learning models, and supervised learning models, and are capable of approximating solutions of complex non-linear problems.

In some embodiments, the data acquisition system (108) may include functionality for applying deep learning methodologies to precisely determine various subsurface layers. To do so, a large amount of interpreted data may be used to train a model. To obtain this amount of data, the data acquisition system (108) may augment acquired data for various geological scenarios and drilling situations. For example, drilling logs may provide similar log signatures for a particular subsurface layer except where a well encounters abnormal cases. Such abnormal cases may include, for example, changes in subsurface geological compositions, well placement of artificial materials, or various subsurface mechanical factors that may affect logging tools. As such, the amount of well data with abnormal cases available to the data acquisition system (108) may be insufficient for training a model. Therefore, in some embodiments, the data acquisition system (108) may use data augmentation to generate a dataset that combines original acquired data with augmented data based on geological and drilling factors. This supplemented dataset may provide sufficient training data to obtain the trained model (130) accordingly.

In some embodiments, the data acquisition system (108) is implemented in a software platform for the control system (118). The software platform may obtain data acquired by the system of the well (102) as inputs, which may include multiple data types from multiple sources. The software platform may aggregate the data from these systems in real time for rapid analysis. Real-time of or relating to computer systems in the software platform is defined as the actual time for updating information with instantaneous processing at the same rate as required by a user or necessitated by a process being controlled. In some embodiments, the control system (118) or the data acquisition system (108) may include a computer system with a computer processor (120) that is similar to the computer system (1000) described with regard to FIGS. 10A and 10B and the accompanying description. The computer processor (120) with an acquisition software controls the data survey, communicates with other units of the seismic data acquisition environment (100), and stores seismic data records in files.

FIG. 1B illustrates a system of digital automatic tuning in accordance with one or more embodiments. FIG. 1 illustrates a conceptual block diagram for digital automatic tuning (150) that may include a digitally programmable filter (152) and a tuning test circuit (154), which are controlled by a DSP (158) using a digital tuning control (162). In addition, the tuning test circuit (154) provides a test result (156) to the DSP (158). In mixed analog/digital systems, the digital automatic tuning feature allows direct interfacing with the DSP (158).

In some embodiments, the DSP (158), available in most modern systems, is utilized to adapt the filter parameters with minimum additional hardware. Based on the test result (156), the DSP (158) provides the digital tuning control (162) to the digitally programmable filter (152) and further to the tuning test circuit (154). In addition, the DSP (158) provides a band/gain control (160) to the digitally programmable filter (152) for further automatic tuning.

In one or more embodiments, the DSP (158) is utilized to program the digitally programmable filter (152) to operate at different bandwidths and/or different gain settings. For example, to design an analog baseband chain for multi-standard wireless receivers, the digital automatic frequency tuning scheme, as shown in FIG. 1B, is employed to compensate for both components and temperature variations. The DSP tuning scheme, shown in FIG. 1B, avoids the feedthrough problems associated with the real time master-slave tuning approach which limits system dynamic ranges.

Figure 2:
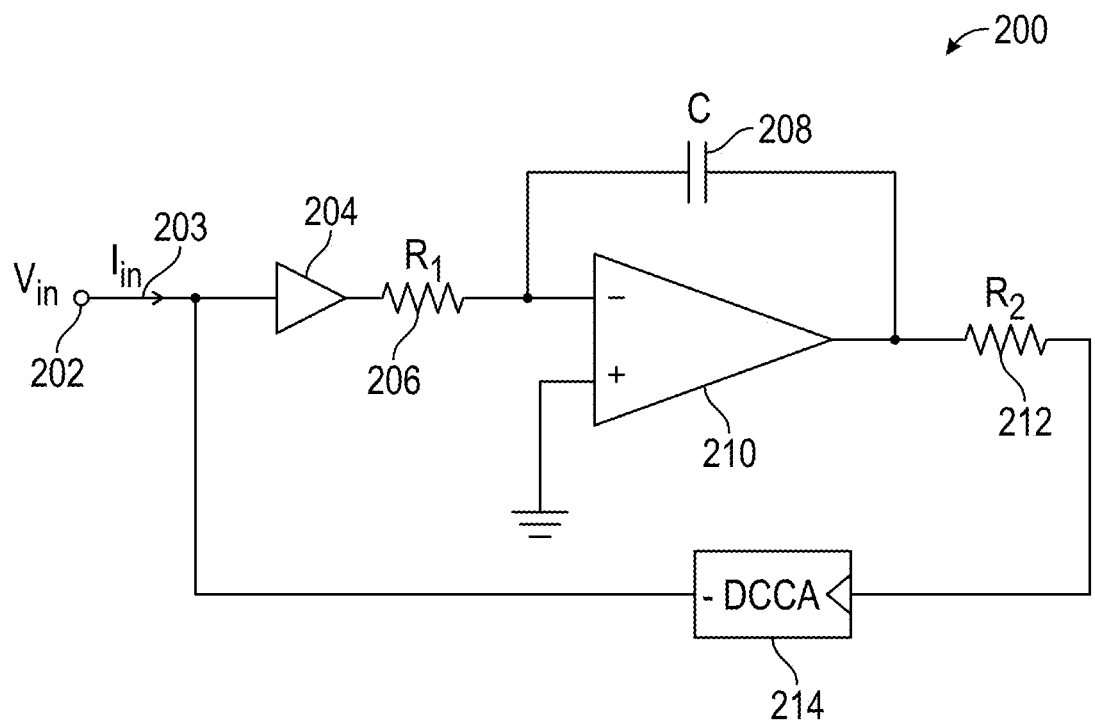
FIG. 2 shows a schematic diagram of a first exemplary circuit implementation of a digitally controlled grounded inductor simulation in accordance with one or more embodiments.

Turning to FIG. 2, FIG. 2 illustrates a schematic diagram of a first exemplary circuit (200) implementation of a digitally controlled grounded inductor simulation in accordance with one or more embodiments. The first exemplary circuit (200) of the digitally controlled grounded inductor simulation comprises a voltage buffer (204), two resistors $R_1$ (206) and $R_2$ (212), a capacitor C (208), an OP-AMP (210), and a digitally controlled current amplifier (DCCA) (214). An input voltage $V_{in}$ (202) and an input current $I_{in}$ (203) are provided to the first exemplary circuit (200) as shown in FIG. 2. The CMOS realization of the OP-AMP (210) with an example is described with regard to FIG. 4 and the accompanying description. The CMOS realization of the DCCA (214) with an example is described with regard to FIG. 6 and the accompanying description.

In some embodiments, the ideal terminal characteristics of the DCCA (214) are expressed as $V_{in}$ (202)=0 and an output current $I_o = AI_i$ (not shown), where A is a digitally controlled current gain of the DCCA (214). Therefore, the first exemplary circuit (200) of FIG. 2 exhibits an input impedance $Z_{in1}$ given by:

$$Z_{in1} = s\frac{CR_1R_2}{A} = sL_{eq1} \quad (1)$$

where, $L_{eq1}$ is an equivalent inductance value of the first exemplary circuit (200) given by $CR_1R_2/A$ and is tuned using the digitally controlled current gain A of the DCCA (214). The digitally controlled current gain A of the DCCA (214) is utilized to provide precise frequency and/or gain characteristics that can be tuned over a wide range. In some embodiments, polysilicon resistors and capacitors are used to realize the filter time constants, which results in highly linear filters. The working of the first exemplary circuit (200) along with an example is described with regard to FIGS. 7 and 8A and the accompanying descriptions.

Figure 3:
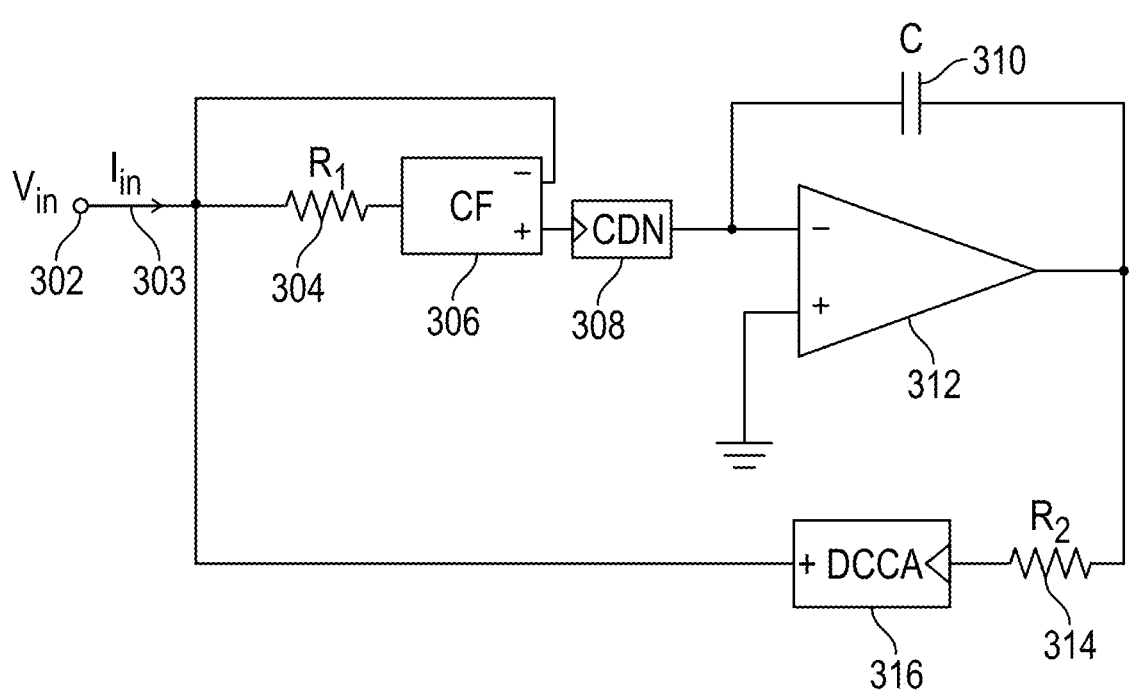
FIG. 3 shows a schematic diagram of a second exemplary circuit implementation of a digitally controlled grounded inductor simulation in accordance with one or more embodiments.

Turning to FIG. 3, FIG. 3 illustrates a schematic diagram of a second exemplary circuit (300) implementation of a digitally controlled grounded inductor simulation in accordance with one or more embodiments. The second exemplary circuit (300) of the digitally controlled grounded inductor simulation comprises two resistors $R_1$ (304) and $R_2$ (314), a dual output current follower (CF) (306), an active current division network (CDN) (308), a capacitor C (310), an OP-AMP (312), and a digitally controlled current amplifier (DCCA) (316). An input voltage $V_{in}$ (302) and an input current $I_{in}$ (303) are provided to the second exemplary circuit (300) as shown in FIG. 3. The CMOS realization of the OP-AMP (312) with an example is described with regard to FIG. 4 and the accompanying description. The CMOS realization of the DCCA (316) with an example is described with regard to FIG. 6 and the accompanying description.

In some embodiments, given that the dual output CF (306) is ideally characterized as $V_{in}=0$, $I_o=-(I_{o+})=I_i$, while the current relation of the active CDN (308) is $I_o=\alpha I_i$, where $\alpha$ is digitally controlled attenuation factor, an input impedance $Z_{in2}$ of the second exemplary circuit (300) of FIG. 3 is given by:

$$Z_{in2} = s\frac{CR_1R_2}{\alpha A} = sL_{eq2} \quad (2)$$

where, $L_{eq2}$ is an equivalent inductance value of the second exemplary circuit (300) given by $CR_1R_2/\alpha A$ and is tuned using the digitally controlled attenuation factor $\alpha$ of the active CDN (308) and a digitally controlled current gain A of the DCCA (316). The CMOS realization of the CDN (308) with an example is described with regard to FIG. 5 and the accompanying description.

In one or more embodiments, a nominal value of $L_{eq2}$ is when $A=\alpha=1$. This equivalent inductance value of the second exemplary circuit (300) is increased by the digitally controlled attenuation factor $\alpha$ (i.e. $\alpha<1$) and decreased by the digitally controlled current gain A (i.e. $A>1$) and hence a wide tuning range can be achieved. For example, using a 6-bit active CDN and a 6-bit DCCA in the second exemplary circuit (300), tuning range of $2^{12}$ can ideally be obtained.

Figure 8A:
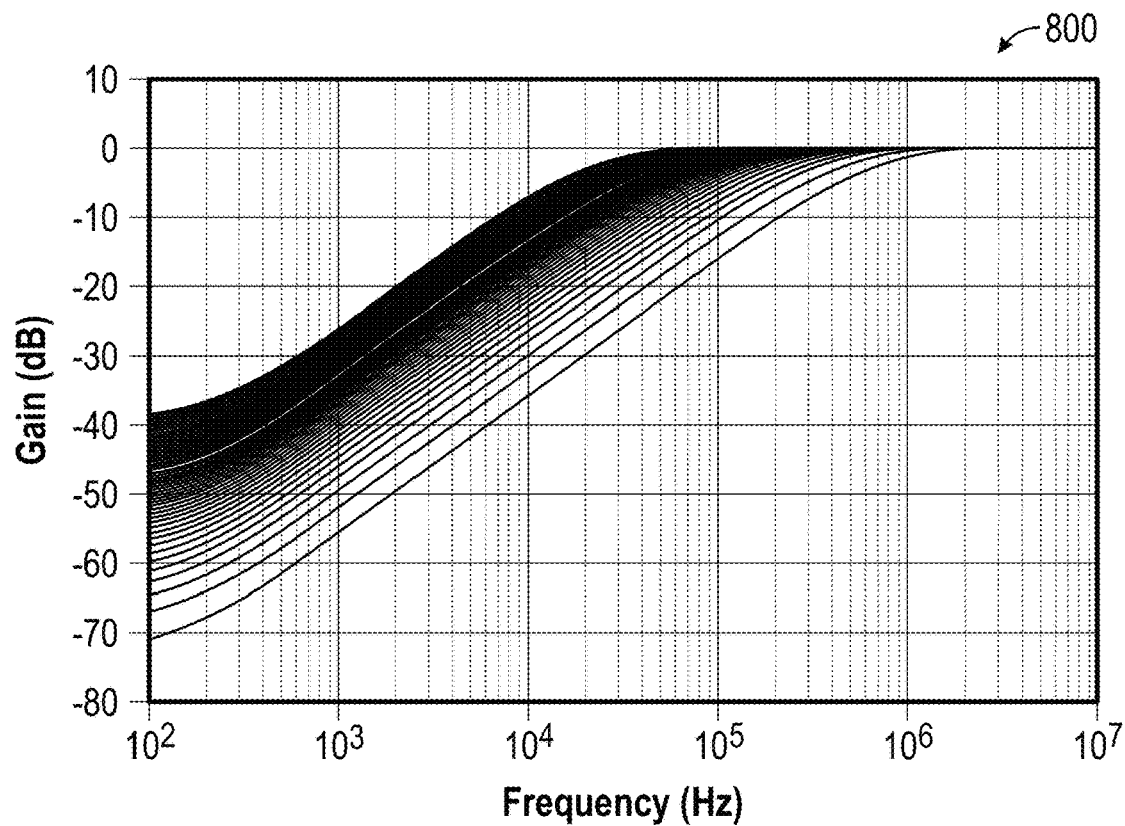
FIGS. 8A and 8B show plots in accordance with one or more embodiments.
Figure 8B:
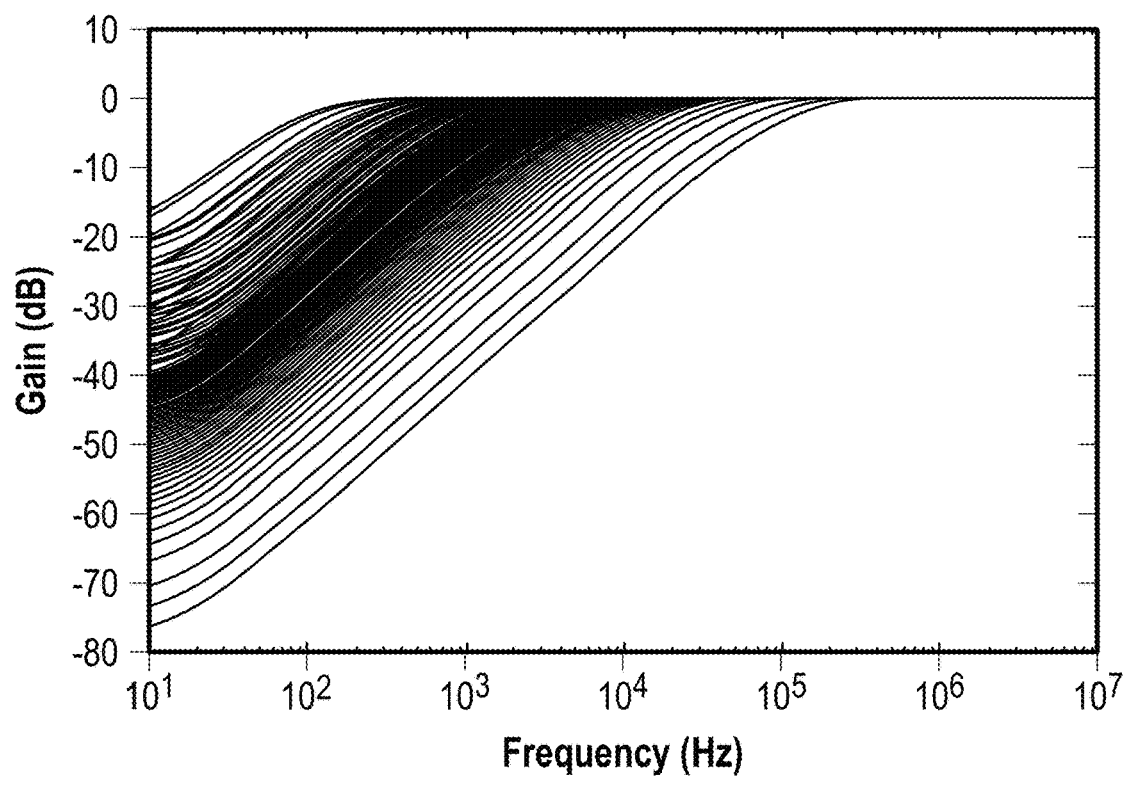

The working of the second exemplary circuit (300) along with an example is described with regard to FIG. 8B and the accompanying description.

Figure 4:
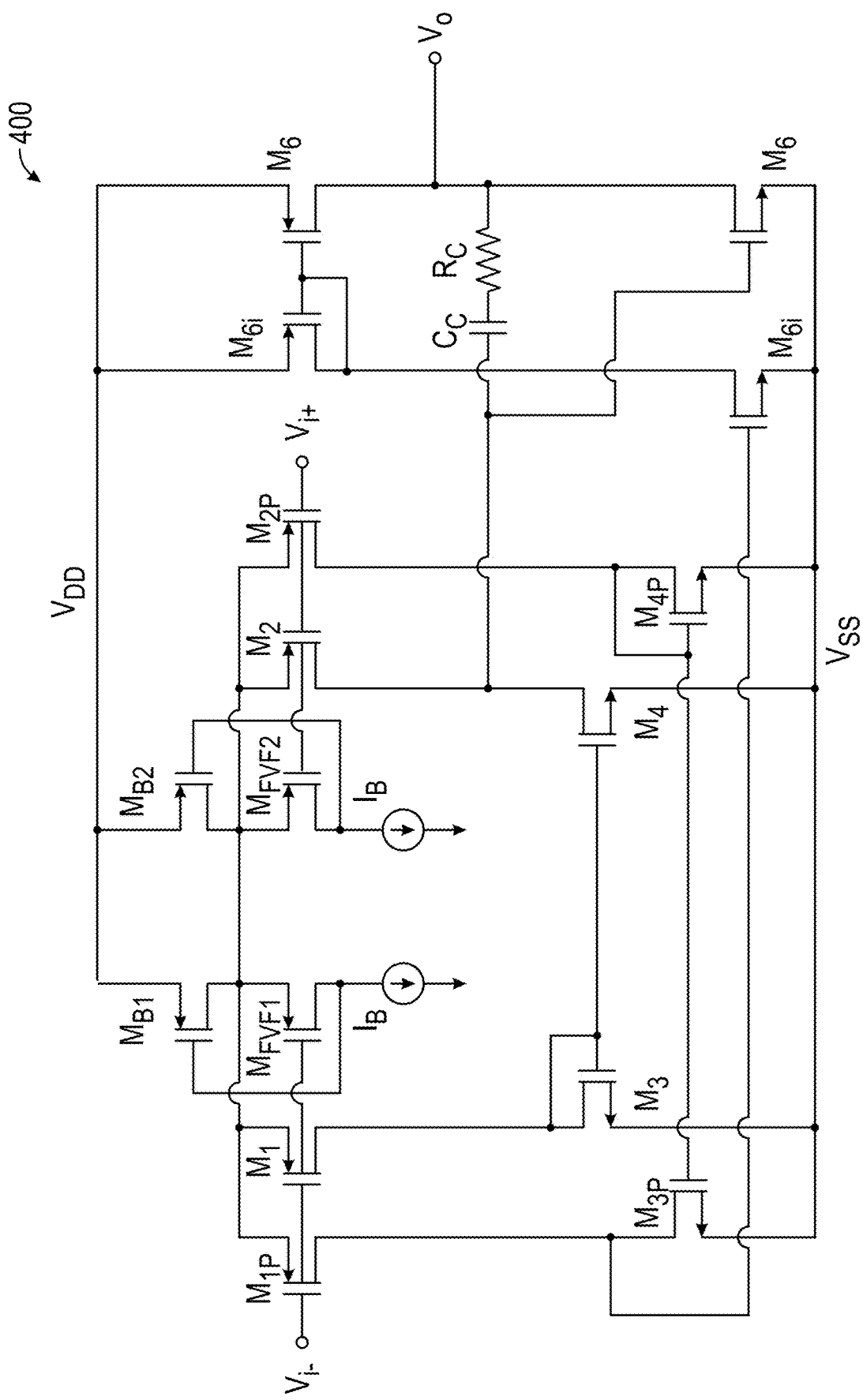
FIG. 4 shows a circuit schematic in accordance with one or more embodiments.

Turning to FIG. 4, FIG. 4 shows a circuit schematic (400) of CMOS realization of the OP-AMP (210) from FIG. 2 and the OP-AMP (312) from FIG. 3 in accordance with one or more embodiments. The OP-AMP (210) and OP-AMP (312) employ class-AB operation for the input and output stages (class AB/AB OP-AMPs), delivers high current peaks with small quiescent currents, and hence have very low power consumption.

In some embodiments, the fully-differential topology of the circuit (400) consists of two class AB stages: the input stage consists of transistors $M_{1-4}$, $M_6$, $M_8$, $M_{1P}$-$M_{2P}$, $M_{FVF(1,2)}$, and $M_{B(1,2)}$. In this case, two Flipped Voltage Followers (FVF) formed by transistors $M_{FVF(1,2)}$ and $M_{B(1,2)}$ are used to generate a very low impedance at the common source node of transistors $M_1$, $M_2$, $M_{1P}$, $M_{2P}$, and $M_{FVF(1,2)}$. This common source node follows the maximum value of the input voltages $V_{i-}$, $V_{i+}$. Due to this property, this stage is usually addressed as Winner Take All (WTA). This maximum value sets the drain currents in the transistors of this stage.

Assuming matched transistors $M_1$, $M_2$, $M_{1P}$, $M_{2P}$, and $M_{FVF(1,2)}$ a quiescent current in $M_1$-$M_2$ and $M_{1P}$-$M_{2P}$ with value $I_B$ results. By application of a large differential input voltage, dynamic currents essentially larger than $I_B$ are generated. Transistors $M_3$, $M_4$, $M_{3P}$, and $M_{4P}$ also form current mirrors which are used to generate complementary currents. As none of transistors $M_1$, $M_2$, $M_{1P}$, and $M_{2P}$ are driven to cutoff region when a differential signal is applied, this circuit (400) is also attractive in terms of speed and distortion.

The class AB OP-AMP's output stage has the following advantages: It does not require a separate quiescent current control circuit, it can operate at very low supply voltages and it has rail-to-rail output swing. The output stage can deliver large dynamic output current to the external terminal of the compensation capacitors Cc. The double class AB behavior allows the circuit (400) to be biased with very small currents. However, a high slew-rate is obtained since extra-currents are supplied by the adaptive bias. To further reduce the power consumption, the OP-AMP has been designed to operate in weak inversion, which gives the best efficiency in terms of transconductance versus bias current Is. Furthermore, the voltage buffer is obtained using unity negative feedback (connecting Vo to Vi−), as shown in FIG. 4.

Figures 5A, 5B:
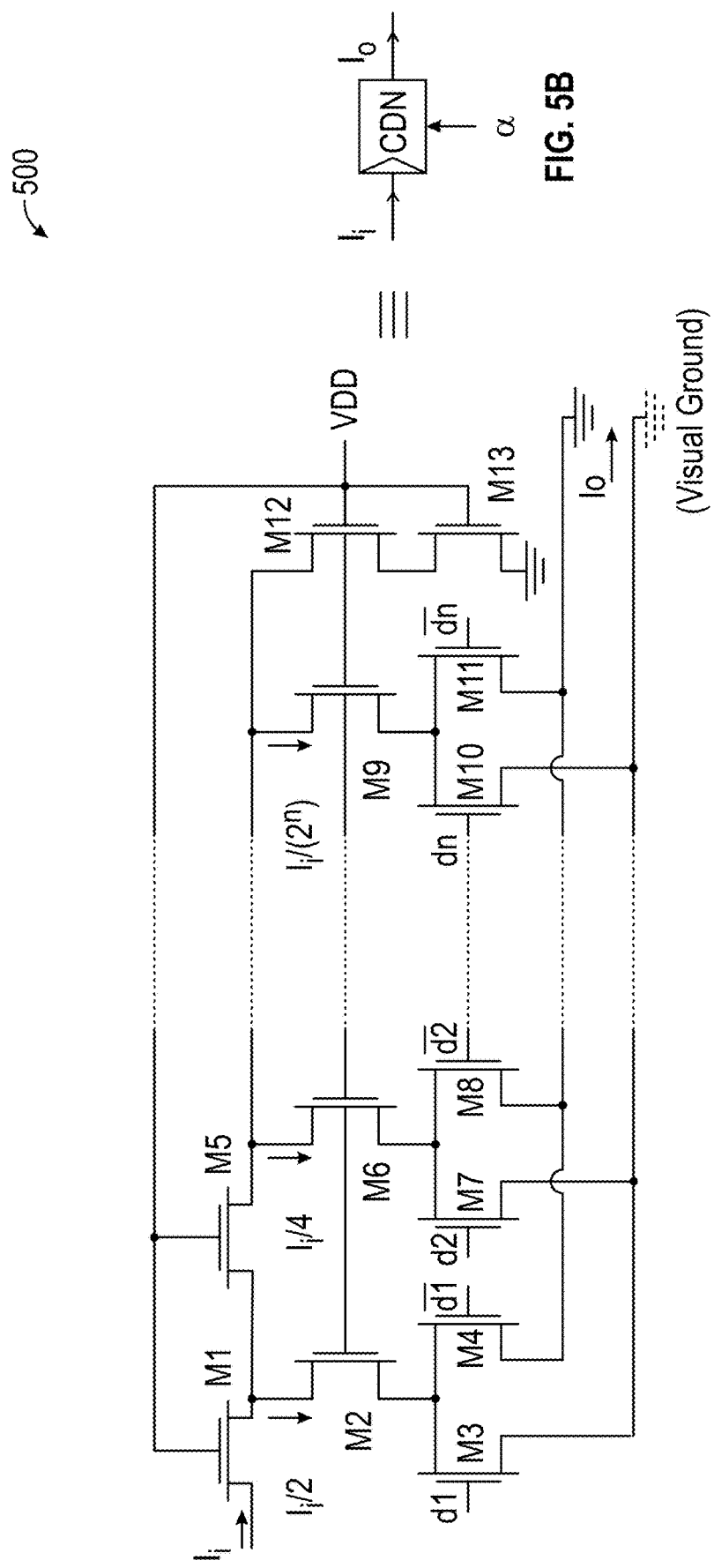
FIG. 5A shows a circuit schematic in accordance with one or more embodiments.
FIG. 5B is a block diagram symbol used herein as an equivalent of the circuit of FIG. 5A in accordance with one or more embodiments.

Turning to FIG. 5A, FIG. 5A shows a circuit schematic (500) of CMOS realization of the active CDN (308) from FIG. 3 in accordance with one or more embodiments. In some embodiments, the DCCA (316) comprises the active CDN with transistors $M_{1-13}$, which performs digital trimming and provides digital tuning of the current gain of the DCCA (316) of the second exemplary circuit (300). The active CDN is inherently linear (i.e., insensitive to second order effects and valid in all MOS operating regions). With all transistors $M_{1-13}$ of the active CDN selected of equal dimensions (width/length), the operation of the active CDN shown in circuit (500) of FIG. 5A is similar to that of the R-2R ladder, which is apparent to one of ordinary skill in the art. The input current is binary weighted through the different branches. Therefore, the output current $I_o$ can be expressed as:

$$I_o = \sum_{i=1}^{n} \frac{d_i I_i}{2^i} = \alpha I_i \quad (3)$$

where $d_i$ is the i-th digital bit and n is the size of control word. The active CDN is suitable for low power operation since it does not dissipate standby current. The proper operation of the active CDN requires an input node to be current driven while an output node to be virtually grounded, as shown in FIG. 5A.

In one or more embodiments, the active CDN exhibits wide bandwidth, inherent linearity, and provides precise digital trimming without any spread in the transistor aspect ratios, which helps to maintain a compact layout area. For example, a 10-bit active CDN can be implemented without trimming. In other words, the active CDN can be digitally trimmed up to 10 bits accuracy without component spreading. The equivalent block diagram of the active CDN with a control input is shown in FIG. 5B.

Figure 6:
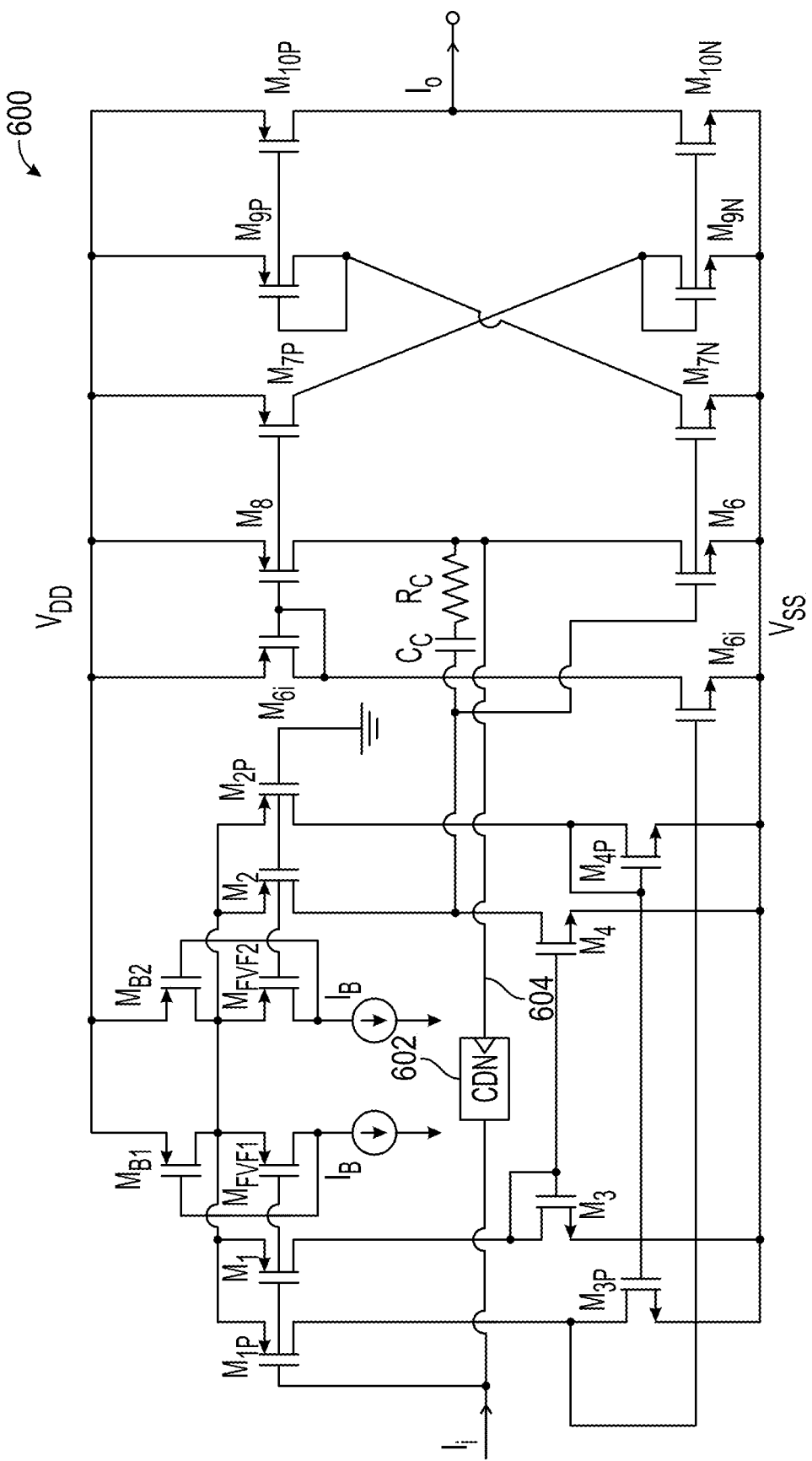
FIG. 6 shows a circuit schematic in accordance with one or more embodiments.

Turning to FIG. 6, FIG. 6 shows a circuit schematic (600) of CMOS realization of the DCCA (214) from FIG. 2 and the DCCA (316) from FIG. 3 in accordance with one or more embodiments. It can be seen that the DCCA shown in FIG. 6 is realized using the circuit (400) for OP-AMP in FIG. 4 with some extensions. A cross couple current mirror stage ($M_{7P}$, $M_{7N}$, $M_{9P}$, $M_{9N}$, $M_{10P}$, $M_{10N}$) is used to copy and invert the output current of the OP-AMP (210) from FIG. 2 and the OP-AMP (312) from FIG. 3. The inversion is needed to obtain a negative type DCCA to be used in the first exemplary circuit (200) and the second exemplary circuit (300).

The operation of the DCCA in the circuit (600) can be explained as follows. An active CDN (602) can be utilized in the design of the DCCA to form the exemplary DCCA (600), as shown in FIG. 6. In some embodiments, without the active CDN (602) (short circuit), a negative feedback establishes the required virtual ground at $V_{i-}$ (since $V_{i+}$ is grounded) which is now used as an input current terminal $I_i$. In some embodiments, with the active CDN (602) in a feedback path (604), a negative feedback adjusts the input ($I_i$ (shown in FIG. 5A)) of the active CDN such that the output ($I_o$ (shown in FIG. 5A)) of the active CDN is equal to the input current $I_i$ of the circuit (600). This will set the output current ($I_o$) to be:

$$I_o = \frac{1}{\sum_{i=0}^{n} \frac{di}{2^i}} I_i = AI_i \quad (4)$$

In some embodiments, a negative type CF (for example, the dual output CF (306)) is simply obtained with the active CDN (602) of the DCCA in the circuit (600) is replaced by a short circuit. Two additional transistors copying the current of M6 and M8 are used to obtain the positive output of the CF in the circuit (600).

Figure 7A:
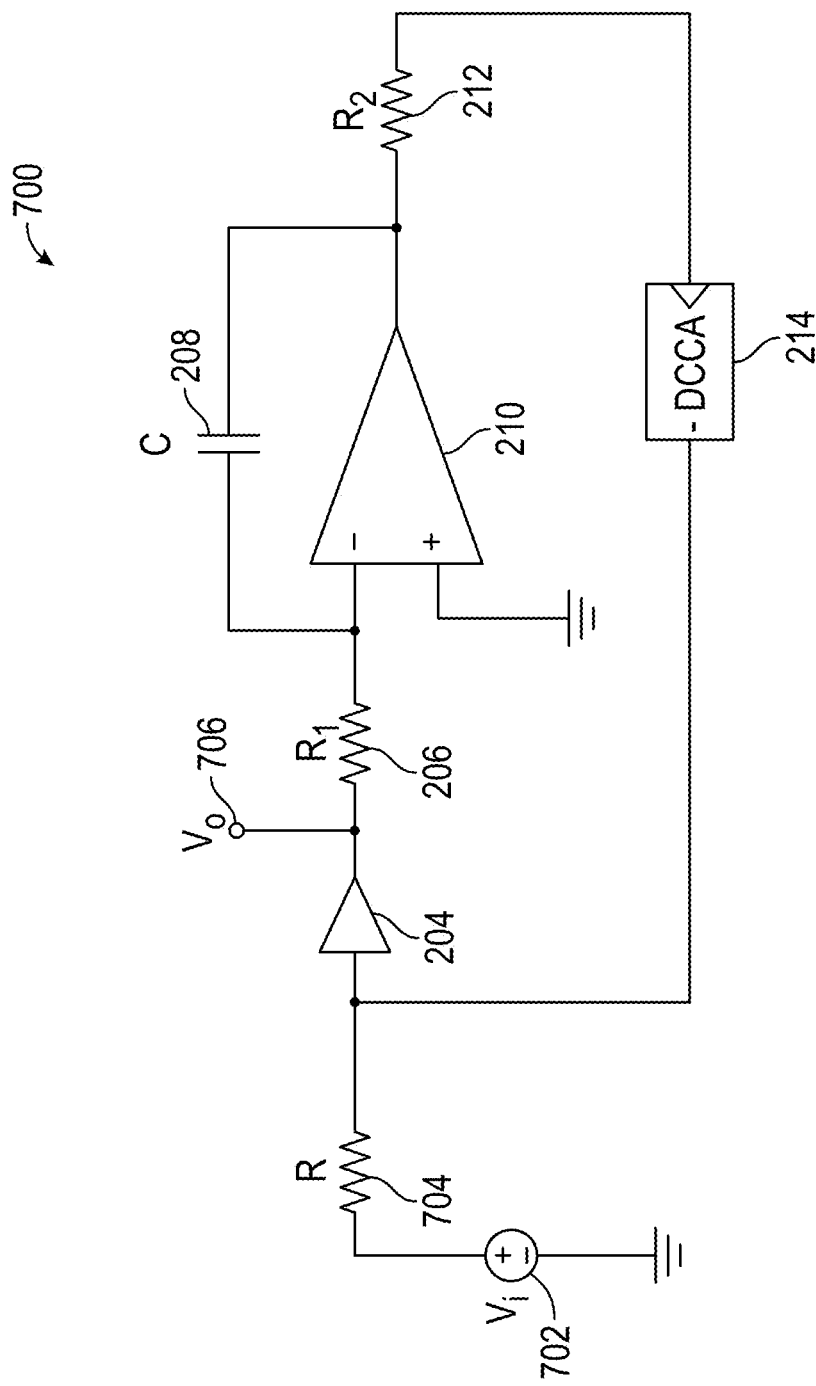
FIG. 7A shows a circuit schematic of an example in accordance with one or more embodiments.

Turning to FIG. 7A, FIG. 7A shows an example of a circuit schematic for realizing a first order high pass filter circuit (700) using the first exemplary circuit (200) in accordance with one or more embodiments. In addition, the circuit (700) comprises an input voltage $V_i$ (702) and a resistor R (704). FIG. 7A further shows an output voltage $V_o$ (706) of the voltage buffer (204). In some embodiments, the circuit (700) was simulated using a standard 90 nm CMOS process. During simulation, for example using commercially available simulator T-Spice v16.3 64-bit, low supply voltages of ±0.75 V and bias current, $I_B$ of 10 μA (shown in FIGS. 4 and 6) were used. For the first exemplary circuit (200) of FIG. 2, C (208)=10 pF, $R_1$ (206)=10 kΩ, $R_2$ (212)=10 kΩ, and R (704)=0.1 kΩ were used. In some embodiments, a 6-bit DCCA was employed to adjust the equivalent inductance value. Results (800) in FIG. 8A show tuning of a pole frequency of the first order high pass filter circuit (700) from 19 kHz to 1 MHz. These correspond to inductors in the range from 16 μH to 0.84 mH.

Figure 7B:
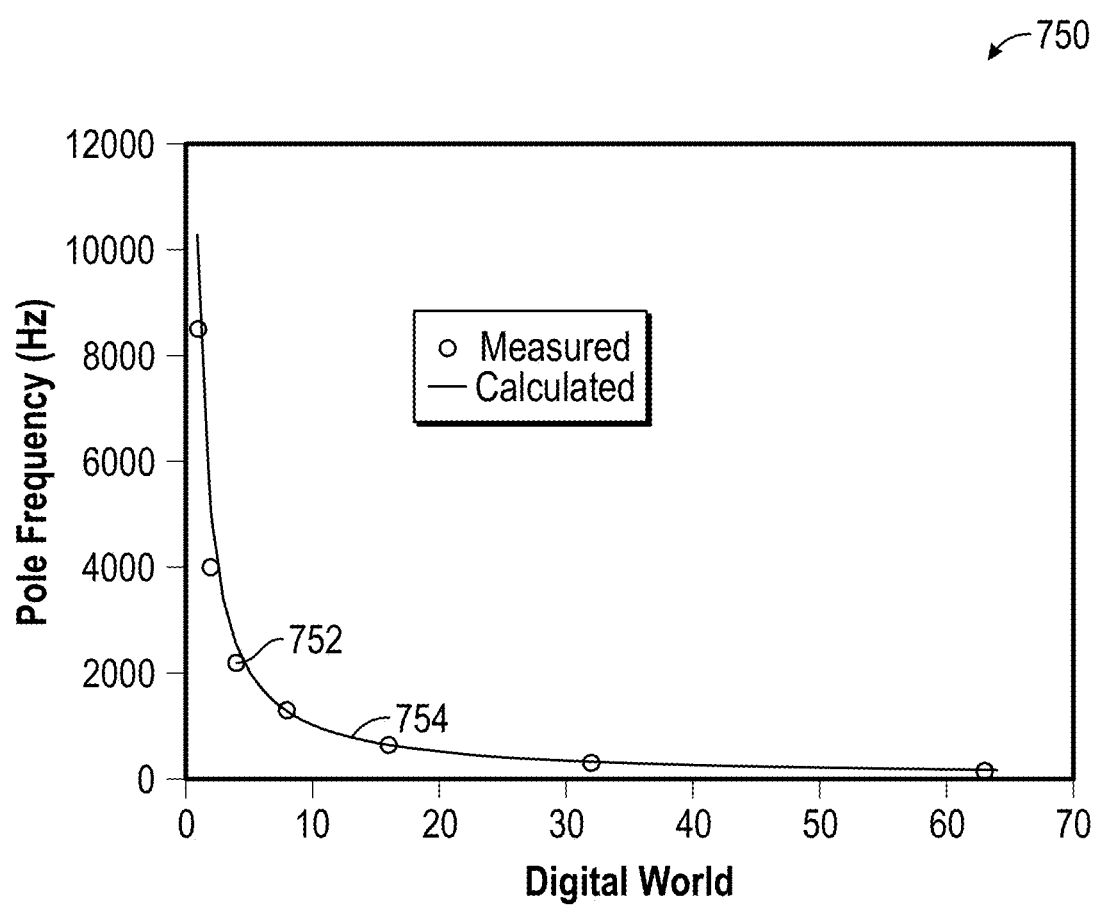
FIG. 7B shows a plot in accordance with one or more embodiments.

In one or more embodiments, the pole frequency of the first order high pass filter circuit (700) is tuned by varying the digitally controlled current gain A of the DCCA (214) using a passive resistor array. Results (750) in FIG. 7B show measurement results (752) of the experimental testing and comparison against calculated results (754) of the first order high pass filter circuit (700) for the passive components C (208)=10 nF, $R_1$ (206)=10 kΩ, $R_2$ (212)=10 kΩ, and R=1 kΩ. The first order high pass filter circuit (700) is implemented, for example, using the 741 Op-Amp IC and AD844 ICs to realize the DCCA (214).

In one or more embodiments, the first order high pass filter circuit is implemented using the second exemplary circuit (300) and is simulated with the components C (310)=100 pF, $R_1$ (304)=10 kΩ, $R_2$ (314)=10 kΩ, and R=0.1 kΩ. The pole frequency is varied using the DCCA (316) and the CDN (308). Results (850) in FIG. 8B show the magnitude responses of the filter using the second exemplary circuit (300). The pole frequency is tuned from 90 Hz to 100 kHz. The corresponding inductors span the range 0.16 mH to 0.18 H.

Figure 9:
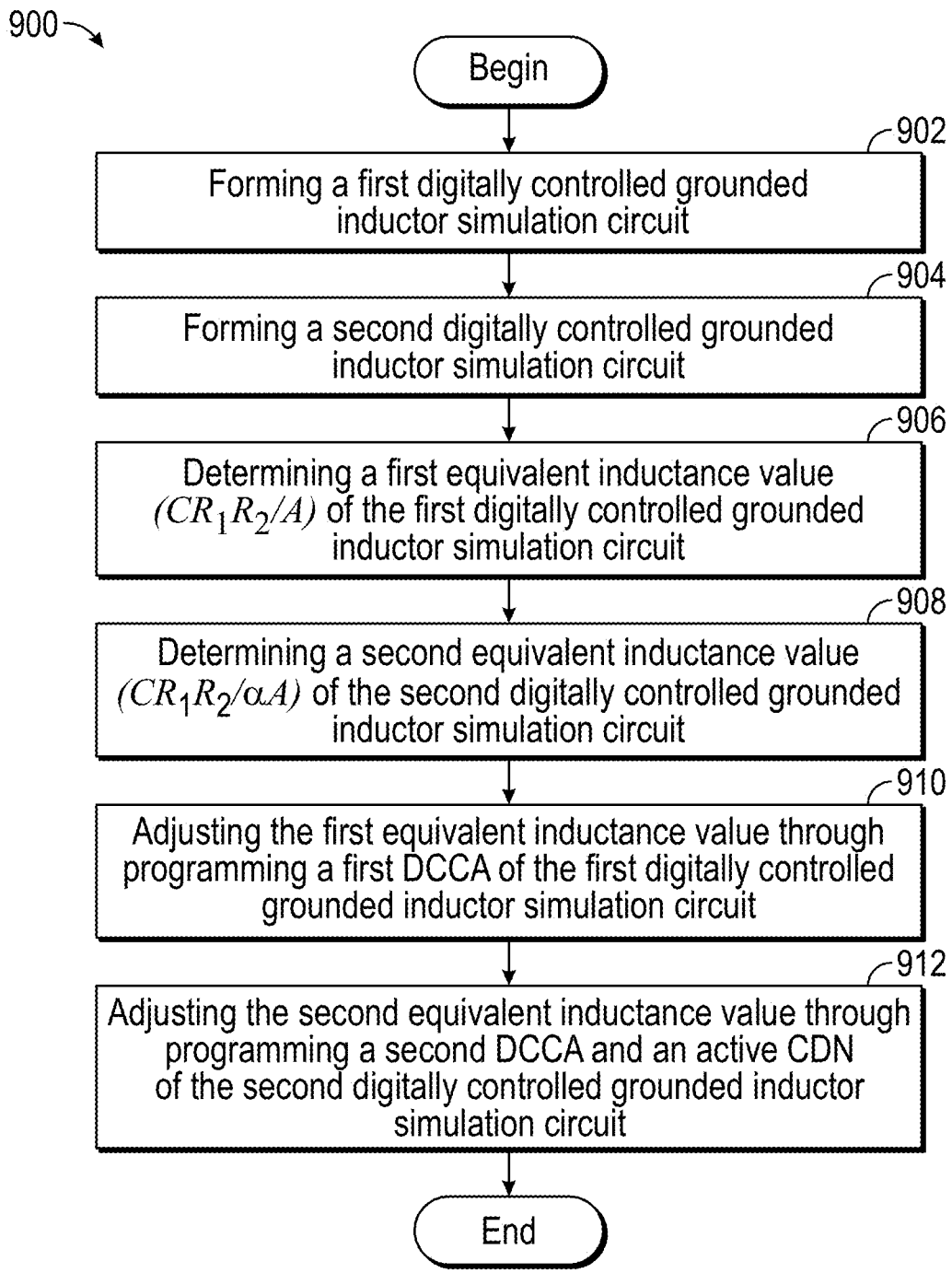
FIG. 9 shows a flowchart in accordance with one or more embodiments.

FIG. 9 shows a flowchart (900) in accordance with one or more embodiments. Specifically, FIG. 9 describes a general method of adjusting the value of an equivalent inductance using digitally controlled grounded inductor simulation circuits. One or more steps in FIG. 9 may be performed by one or more components (for example, the first exemplary circuit (200) and the second exemplary circuit (300)) as described in FIGS. 2-3. While the various steps in FIG. 9 are presented and described sequentially, one of ordinary skill in the art will appreciate that some or all of the steps may be executed in different orders, may be combined or omitted, and some or all of the steps may be executed in parallel. Furthermore, the steps may be performed actively or passively. The method may be repeated or expanded to support multiple components and/or multiple users within a field environment. Accordingly, the scope of the invention should not be considered limited to the specific arrangement of steps shown in the flowchart.

In step 902, a first digitally controlled grounded inductor simulation circuit is formed in accordance with one or more embodiments. For example, the first digitally controlled grounded inductor simulation circuit (for example, the first exemplary circuit (200)) comprises a voltage buffer (for example, voltage buffer (204)), two resistors (for example, $R_1$ (206) and $R_2$ (212)), a capacitor (for example, C (208)), an OP-AMP (for example, OP-AMP (210)), and a digitally controlled current amplifier (for example, DCCA (214)) as described previously in FIG. 2 and the accompanying description.

In step 904, a second digitally controlled grounded inductor simulation circuit is formed in accordance with one or more embodiments. For example, the second digitally controlled grounded inductor simulation circuit (for example, the second exemplary circuit (300)) comprises two resistors (for example, $R_1$ (304) and $R_2$ (314)), a dual output current follower (for example, dual output CF (306)), an active current division network (for example, CDN (308)), a capacitor (for example, C (310)), an OP-AMP (for example, OP-AMP (312)), and a digitally controlled current amplifier (for example, DCCA (316)) as described previously in FIG. 3 and the accompanying description.

In step 906, a first equivalent inductance value of the first digitally controlled grounded inductor simulation circuit is determined in accordance with one or more embodiments. For example, $L_{eq1}=CR_1R_2/A$ of the first exemplary circuit (200) is calculated as described previously in FIG. 2 and the accompanying description.

In step 908, a second equivalent inductance value of the second digitally controlled grounded inductor simulation circuit is determined in accordance with one or more embodiments. For example, $L_{eq2}=CR_1R_2/\alpha A$ of the second exemplary circuit (300) is calculated as described previously in FIG. 3 and the accompanying description.

In step 910, the first equivalent inductance value is adjusted through programming a first DCCA of the first digitally controlled grounded inductor simulation circuit in accordance with one or more embodiments. For example, $L_{eq1}$ of the first exemplary circuit (200) is adjusted using the digitally controlled current gain A of the DCCA (214) as described previously in FIG. 2 and the accompanying description.

In step 912, the second equivalent inductance value is adjusted through programming a second DCCA and an active CDN of the second digitally controlled grounded inductor simulation circuit in accordance with one or more embodiments. For example, $L_{eq2}$ of the second exemplary circuit (300) is adjusted using the digitally controlled attenuation factor α of the active CDN (308) and the digitally controlled current gain A of the DCCA (316) as described previously in FIG. 3 and the accompanying description.

In other words, the embodiments of the invention for the concept of the used to convert passive inductors used in filter design of the ADU from discrete to integration have the advantage to provide digital tuning of the inductor value that can be tuned over wide range and provide better linearity. One or more embodiments of the invention disclosed herein offer the following attractive features: (1) can be digitally controlled with direct interfacing with the DSP part, and (2) compatible with low voltage operation. Also, the first digitally controlled grounded inductor simulation circuit achieves tuning while using two active elements and a voltage buffer. The second digitally controlled grounded inductor simulation circuit has an advantage of programming over a wide range. Additional advantages offered by digital tuning are noise immunity and power saving option and most importantly the compatibility to modern mixed mode (analog/digital) systems.

Figure 10A:
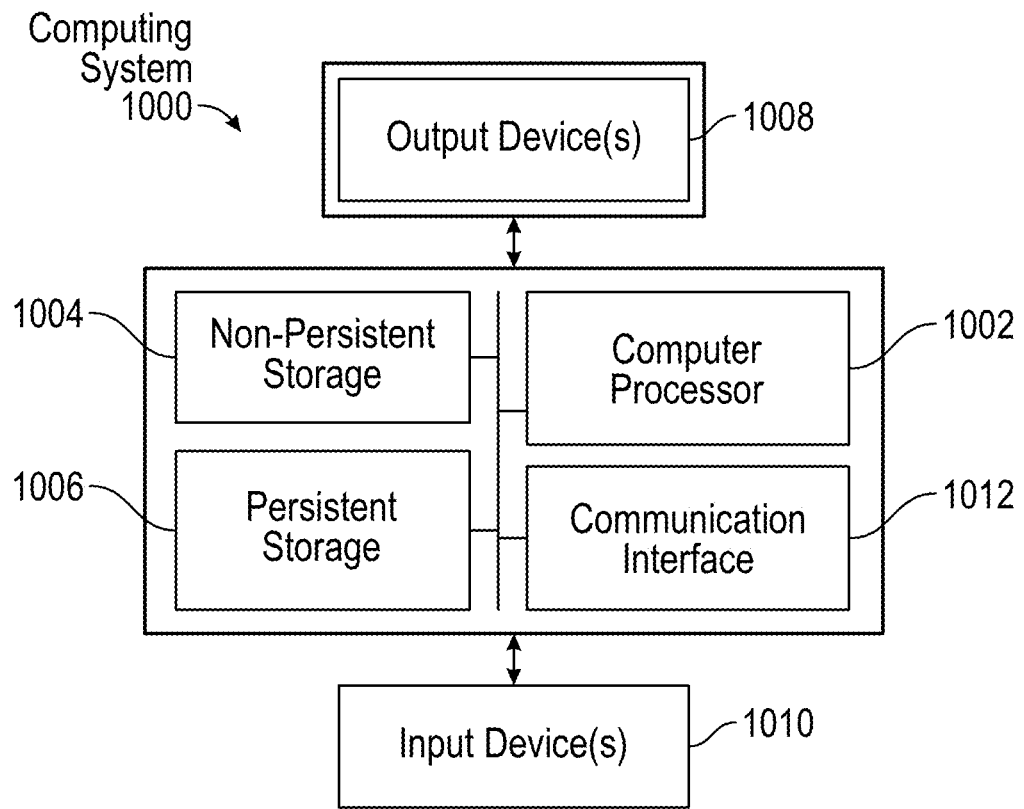
FIGS. 10A and 10B show a computing system in accordance with one or more embodiments.

Embodiments may be implemented on a computing system. Any combination of mobile, desktop, server, router, switch, embedded device, or other types of hardware may be used. For example, as shown in FIG. 10A, the computing system (1000) may include one or more computer processors (1002), non-persistent storage (1004) (for example, volatile memory, such as random access memory (RAM), cache memory), persistent storage (1006) (for example, a hard disk, an optical drive such as a compact disk (CD) drive or digital versatile disk (DVD) drive, a flash memory), a communication interface (1012) (for example, Bluetooth interface, infrared interface, network interface, optical interface), and numerous other elements and functionalities.

The computer processor(s) (1002) may be an integrated circuit for processing instructions. For example, the computer processor(s) may be one or more cores or micro-cores of a processor. The computing system (1000) may also include one or more input devices (1010), such as a touchscreen, keyboard, mouse, microphone, touchpad, or electronic pen.

The communication interface (1012) may include an integrated circuit for connecting the computing system (1000) to a network (not shown) (for example, a local area network (LAN), a wide area network (WAN), such as the Internet, mobile network, or any other type of network) or to another device, such as another computing device.

Further, the computing system (1000) may include one or more output devices (1008), such as a screen (for example, a liquid crystal display (LCD), a plasma display, touchscreen, cathode ray tube (CRT) monitor, or projector), a printer, external storage, or any other output device. One or more of the output devices may be the same or different from the input device(s). The input and output device(s) may be locally or remotely connected to the computer processor(s) (1002), non-persistent storage (1004), and persistent storage (1006). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s) is configured to perform one or more embodiments of the disclosure.

Figure 10B:
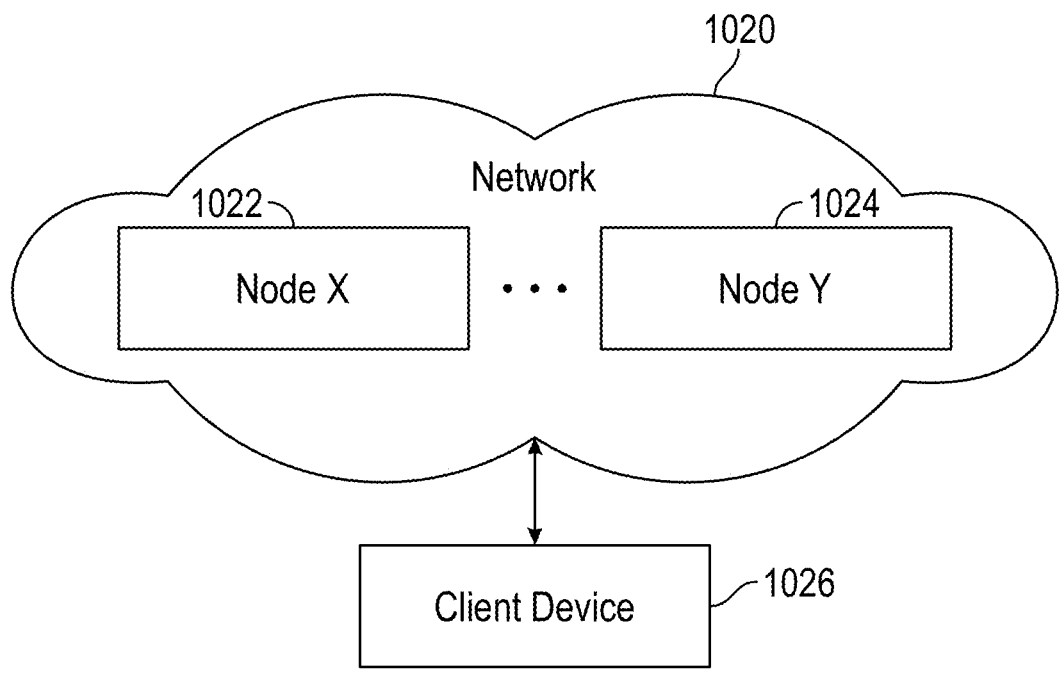

The computing system (1000) in FIG. 10A may be connected to or be a part of a network. For example, as shown in FIG. 10B, the network (1020) may include multiple nodes (for example, node X (1022), node Y (1024)). Each node may correspond to a computing system, such as the computing system shown in FIG. 10A, or a group of nodes combined may correspond to the computing system shown in FIG. 10A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (1000) may be located at a remote location and connected to the other elements over a network.

Although not shown in FIG. 10B, the node may correspond to a blade in a server chassis that is connected to other nodes via a backplane. By way of another example, the node may correspond to a server in a data center. By way of another example, the node may correspond to a computer processor or micro-core of a computer processor with shared memory or resources.

The nodes (for example, node X (1022), node Y (1024)) in the network (1020) may be configured to provide services for a client device (1026). For example, the nodes may be part of a cloud computing system. The nodes may include functionality to receive requests from the client device (1026) and transmit responses to the client device (1026). The client device (1026) may be a computing system, such as the computing system shown in FIG. 10A. Further, the client device (1026) may include or perform all or a portion of one or more embodiments of the disclosure.

The computing system or group of computing systems described in FIGS. 10A and 10B may include functionality to perform a variety of operations disclosed herein. For example, the computing system(s) may perform communication between processes on the same or different systems.

A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided in subsequent paragraphs.

Based on the client-server networking model, sockets may serve as interfaces or communication channel endpoints enabling bidirectional data transfer between processes on the same device. Foremost, following the client-server networking model, a server process (for example, a process that provides data) may create a first socket object. Next, the server process binds the first socket object, thereby associating the first socket object with a unique name or address. After creating and binding the first socket object, the server process then waits and listens for incoming connection requests from one or more client processes (for example, processes that seek data). At this point, when a client process wishes to obtain data from a server process, the client process starts by creating a second socket object. The client process then proceeds to generate a connection request that includes at least the second socket object and the unique name or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (for example, bytes).

Shared memory refers to the allocation of virtual memory space in order to substantiate a mechanism for which data may be communicated or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the selection by the user.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the selection by the user. Further to the above example, the data received from the server after selecting the URL link may provide a web page in Hyper Text Markup Language (HTML) that may be rendered by the web client and displayed on the user device.

Once data is obtained, such as by using techniques described previously or from storage, the computing system, in performing one or more embodiments of the disclosure, may extract one or more data items from the obtained data. For example, the extraction may be performed as follows by the computing system (1000) in FIG. 10A. First, the organizing pattern (for example, grammar, schema, layout) of the data is determined, which may be based on one or more of the following: position (for example, bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 10A, while performing one or more embodiments of the disclosure, may perform data comparison. Data comparison may be used to compare two or more data values (for example, A, B). For example, one or more embodiments may determine whether A>B, A=B, A!=B, A<B, etc. The comparison may be performed by submitting A, B, and an opcode specifying an operation related to the comparison into an arithmetic logic unit (ALU) (that is, circuitry that performs arithmetic or bitwise logical operations on the two data values). The ALU outputs the numerical result of the operation or one or more status flags related to the numerical result. For example, the status flags may indicate whether the numerical result is a positive number, a negative number or zero. By selecting the proper opcode and then reading the numerical results or status flags, the comparison may be executed. For example, in order to determine if A>B, B may be subtracted from A (that is, A−B), and the status flags may be read to determine if the result is positive (that is, if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 10A may implement or be connected to a data repository. For example, one type of data repository is a database. A database is a collection of information configured for ease of data retrieval, modification, re-organization, and deletion. Database management system (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (for example, join, full join, count, average), sort (for example, ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 10A may include functionality to present raw or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, for example, data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, for example, by obtaining data from a data attribute within the data object that identifies the data object type. Then, the GUI may determine any rules designated for displaying that data object type, for example, rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The previous description of functions presents only a few examples of functions performed by the computing system of FIG. 10A and the nodes or client device in FIG. 10B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed. Accordingly, the scope of the disclosure should be limited only by the attached claims.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A digitally controlled grounded inductor simulation circuit, comprising:
   an operational amplifier (OP-AMP),
   a digitally controlled current amplifier (DCCA),
   a voltage buffer,
   two resistors, and
   a capacitor,
   wherein the digitally controlled grounded inductor simulation circuit allows adjustment of an equivalent inductance value $CR_1R_2/A$ through programming a digitally controlled current gain A of the DCCA, by a computer system coupled to the digitally controlled grounded inductor simulator circuit, and
   wherein C is a capacitance of the capacitor, $R_1$ is a resistance of a first resistor, and $R_2$ is a resistance of a second resistor.

2. The digitally controlled grounded inductor simulation circuit of claim 1, wherein the digitally controlled grounded inductor simulation circuit is designed using a standard complementary metal-oxide-semiconductor (CMOS) technology.

3. The digitally controlled grounded inductor simulation circuit of claim 1, wherein the OP-AMP employs class-AB operation for an input stage and an output stage of the digitally controlled grounded inductor simulation circuit.

4. The digitally controlled grounded inductor simulation circuit of claim 1, wherein the voltage buffer of the digitally controlled grounded inductor simulation circuit is obtained using unity negative feedback.

5. The digitally controlled grounded inductor simulation circuit of claim 1, wherein the digitally controlled grounded inductor simulation circuit is used in geophone systems to assist in seismic data acquisition.

6. A digitally controlled grounded inductor simulation circuit, comprising:
   an operational amplifier (OP-AMP),
   a digitally controlled current amplifier (DCCA),
   a dual output current follower (CF),
   an active current division network (CDN),
   two resistors, and
   a capacitor,
   wherein the digitally controlled grounded inductor simulation circuit allows adjustment of an equivalent inductance value $CR_1R_2/\alpha A$ via programming the active CDN and the DCCA, by a computer system coupled to the digitally controlled grounded inductor simulator circuit, and
   wherein C is a capacitance of the capacitor, $R_1$ is a resistance of a first resistor, $R_2$ is a resistance of a second resistor, A is a digitally controlled current gain of the DCCA and $\alpha$ is a digitally controlled attenuation factor of the active CDN.

7. The digitally controlled grounded inductor simulation circuit of claim 6, wherein the equivalent inductance value is programmed using the digitally controlled attenuation factor $\alpha$ of the active CDN and the digitally controlled current gain A of the DCCA.

8. The digitally controlled grounded inductor simulation circuit of claim 7, wherein the equivalent inductance value is increased by the digitally controlled attenuation factor of the active CDN and is decreased by the digitally controlled current gain of the DCCA to achieve a wide tuning range.

9. The digitally controlled grounded inductor simulation circuit of claim 6, wherein the digitally controlled grounded inductor simulation circuit is designed using a standard complementary metal-oxide-semiconductor (CMOS) technology.

10. The digitally controlled grounded inductor simulation circuit of claim 6,
    wherein the OP-AMP employs class-AB operation for an input stage and an output stage of the digitally controlled grounded inductor simulation circuit, and
    wherein the class-AB operation is characterized by the input and output stages delivering high current peaks with small quiescent currents and very low power consumption.

11. The digitally controlled grounded inductor simulation circuit of claim 6, wherein the DCCA of the digitally controlled grounded inductor simulation circuit has a negative feedback.

12. The digitally controlled grounded inductor simulation circuit of claim 6, wherein the digitally controlled grounded inductor simulation circuit is used in geophone systems to assist in seismic data acquisition.

13. A method for a digitally controlled grounded inductor simulation circuit, the method comprising:
    forming a first digitally controlled grounded inductor simulation circuit,
    wherein the first digitally controlled grounded inductor simulation circuit comprises:
      an operational amplifier (OP-AMP),
      a digitally controlled current amplifier (DCCA),
      a voltage buffer,
      two resistors, and
      a capacitor;
    forming a second digitally controlled grounded inductor simulation circuit,
    wherein the second digitally controlled grounded inductor simulation circuit comprises:
      an OP-AMP,
      a DCCA,
      an active current division network (CDN),
      two resistors, and
      a capacitor;
    determining, by a computer system coupled to the first digitally controlled grounded inductor simulator circuit, a first equivalent inductance value $CR_1R_2/A$ of the first digitally controlled grounded inductor simulation circuit,
      wherein C is a capacitance of the capacitor, $R_1$ is a resistance of the first resistor, $R_2$ is a resistance of a second resistor and A is a digitally controlled current gain of the DCCA,
    determining, by the computer system coupled to the second digitally controlled grounded inductor simulator circuit, a second equivalent inductance value $CR_1R_2/\alpha A$ of the second digitally controlled grounded inductor simulation circuit,
      wherein C is the capacitance of the capacitor, $R_1$ is the resistance of the first resistor, $R_2$ is the resistance of the second resistor, A is a digitally controlled current gain of the DCCA and $\alpha$ is a digitally controlled attenuation factor of the active CDN,
    adjusting, by the computer system, the first equivalent inductance value through programming the first DCCA of the first digitally controlled grounded inductor simulation circuit, and
    adjusting, by the computer system, the second equivalent inductance value through programming the second DCCA and the active CDN of the second digitally controlled grounded inductor simulation circuit.

14. The method of claim 13, wherein the first equivalent inductance value is programmed using a digitally controlled current gain A of the first DCCA.

15. The method of claim 13, wherein the second equivalent inductance value is programmed using a digitally controlled current gain A of the second DCCA and a digitally controlled attenuation factor $\alpha$ of the active CDN.

16. The method of claim 15, wherein the second equivalent inductance value is increased by the digitally controlled attenuation factor of the active CDN and is decreased by the digitally controlled current gain of the second DCCA to achieve a wide tuning range.

17. The method of claim 13, wherein the first and second digitally controlled grounded inductor simulation circuits are designed using a standard complementary metal-oxide-semiconductor (CMOS) technology.

18. The method of claim 13, wherein the voltage buffer of the first digitally controlled grounded inductor simulation circuit is obtained using unity negative feedback.

19. The method of claim 13, wherein the second DCCA of the second digitally controlled grounded inductor simulation circuit has negative feedback.

20. The method of claim 13, wherein the first and second digitally controlled grounded inductor simulation circuits are used in geophone systems to assist in seismic data acquisition.

* * * * *